United States Patent
Liu et al.

(10) Patent No.: US 10,361,336 B2
(45) Date of Patent: *Jul. 23, 2019

(54) ULTRAFAST LIGHT EMITTING DIODES FOR OPTICAL WIRELESS COMMUNICATIONS

(71) Applicant: The Regents of The University of California, Oakland, CA (US)

(72) Inventors: Zhaowei Liu, San Diego, CA (US); Danyong Dylan Lu, San Diego, CA (US)

(73) Assignee: The Regents of the University of California, Oakland, CA (US)

( * ) Notice: Subject to any disclaimer, the term of this patent is extended or adjusted under 35 U.S.C. 154(b) by 143 days.

This patent is subject to a terminal disclaimer.

(21) Appl. No.: 15/824,980

(22) Filed: Nov. 28, 2017

(65) Prior Publication Data
US 2019/0035967 A1    Jan. 31, 2019

Related U.S. Application Data

(63) Continuation of application No. 15/128,723, filed as application No. PCT/US2015/023192 on Mar. 27, 2015, now Pat. No. 9,865,768.
(Continued)

(51) Int. Cl.
*H01L 33/24* (2010.01)
*H01L 33/00* (2010.01)
(Continued)

(52) U.S. Cl.
CPC ........ *H01L 33/0004* (2013.01); *H01L 33/005* (2013.01); *H01L 33/14* (2013.01);
(Continued)

(58) Field of Classification Search
None
See application file for complete search history.

(56) References Cited

U.S. PATENT DOCUMENTS 9,865,768 B2 *   1/2018   Liu .................... H01L 33/0004
2004/0104399 A1   6/2004   Ou et al.
(Continued)

FOREIGN PATENT DOCUMENTS

EP            1995794 A1    11/2008
WO     WO-2012/129176 A1    9/2012

OTHER PUBLICATIONS

Akyildiz, Ian F., Dario Pompili, and Tommaso Melodia. "Underwater acoustic sensor networks: research challenges." Ad hoc networks 3.3 (2005): 257-279.
(Continued)

*Primary Examiner* — Dung Le
(74) *Attorney, Agent, or Firm* — Mintz Levin Cohn Ferris Glovsky and Popeo, P.C.

(57) ABSTRACT

In one aspect, there is provided an apparatus including a light emitting diode. The apparatus may include a plurality of layers including a substrate layer, a buffer layer disposed on the substrate layer, a charge transport layer, a light emission layer, another charge transport layer, and/or a metamaterial layer. The other charge transport layer may have at least one channel etched into the other charge transport layer leaving a residual thickness of the other charge transport layer between a bottom of the etched channel and the light emission layer. A metamaterial layer may be contained in the at least one channel that is proximate to the residual thickness of the charge transport layer. The metamaterial may include a structure including at least
(Continued)

one of a dielectric or a metal. The metamaterial may cause the light emitting diode to operate at higher frequencies and with higher efficiency.

20 Claims, 5 Drawing Sheets

Related U.S. Application Data

(60) Provisional application No. 61/971,444, filed on Mar. 27, 2014.

(51) Int. Cl.
*H01L 33/20* (2010.01)
*H01L 51/52* (2006.01)
*H01L 33/14* (2010.01)
*H01L 51/50* (2006.01)

(52) U.S. Cl.
CPC .............. *H01L 33/20* (2013.01); *H01L 33/24* (2013.01); *H01L 51/5048* (2013.01); *H01L 51/5209* (2013.01); *H01L 51/5225* (2013.01); *H01L 51/5056* (2013.01); *H01L 2933/0083* (2013.01)

(56) References Cited

U.S. PATENT DOCUMENTS

| | | |
|---|---|---|
| 2006/0203871 A1 | 9/2006 | Ueda et al. |
| 2009/0040132 A1 | 2/2009 | Sridhar et al. |
| 2011/0233514 A1 | 9/2011 | Lu et al. |
| 2011/0240957 A1 | 10/2011 | Okuno et al. |

OTHER PUBLICATIONS

Anger, P., Bharadwaj, P. & Novotny,L. "Enhancement and quenching of single-molecule fluorescence". Phys. Rev. Lett. 96, 113002 (2006).
Barnes, W. L. "Fluorescence near interfaces: the role of photonic mode density." journal of modern optics 45.4 (1998): 661-699.
Barnes, W. L., Dereux, A. & Ebbesen, T. W. "Surface plasmon subwavelength optics". Nature 424, 824-830 (2003).
Barton, Daniel L., and Arthur J. Fischer. "Photonic crystals improve LED efficiency." SPIE Newsroom 10.2.1200603 (2006): 0160.
Bozhevolnyi, S.I., "Plasmonics Nanoguides and Circuits," Pan Stanford (2009).
Brongersma, Mark L., and Vladimir M. Shalaev. "The case for plasmonics." Science 328.5977 (2010): 440-441.
Cao, Linyou, and Mark L. Brongersma. "Active plasmonics: ultrafast developments." Nature Photonics 3.1 (2009): 12-13.
Cho, C-H. et al. "Tailoring hot-exciton emission and lifetimes in semiconducting nanowires via whispering-gallery nanocavity plasmons". Nature Mater. 10, 669-675 (2011).
Cho, Chu-Young, et al. "Surface plasmon-enhanced light-emitting diodes with silver nanoparticles and SiO2 nano-disks embedded in p-GaN." Applied Physics Letters 99.4 (2011): 041107.
Cortes, C. L., Newman, W., Molesky, S. & Jacob, Z. "Quantum nanophotonics using hyperbolic metamaterials". J. Opt. 14, 063001 (2012).
Cui, Y. et al. "Ultrabroadband light absorption by a sawtooth anisotropic metamaterial slab". Nano Lett. 12, 1443-1447 (2012).
E.F. Schubert, "Light-Emitting Diodes," Cambridge (2006).
Engheta, Nader. "Circuits with light at nanoscales: optical nanocircuits inspired by metamaterials." Science 317.5845 (2007): 1698-1702.
Fang, Nicholas, et al. "Sub-diffraction-limited optical imaging with a silver superlens." Science 308.5721 (2005): 534-537.
Farr, Norman, et al. "Optical modem technology for seafloor observatories." Oceans 2006. IEEE, 2006.
Fattal, D., et al. "Design of an efficient light-emitting diode with 10 GHz modulation bandwidth." Applied Physics Letters 93.24 (2008): 243501.
Ford, G. W. & Weber, W. H. "Electromagnetic interactions of molecules with metal surfaces". Phys. Rep. 113, 195-287 (1984).
Fort, E. & Gresillon, S. "Surface enhanced fluorescence". J. Phys. D 41, 013001 (2008).
Gansel, Justyna K., et al. "Gold helix photonic metamaterial as broadband circular polarizer." Science 325.5947 (2009): 1513-1515.
Gontijo, I., et al. "Coupling of InGaN quantum-well photoluminescence to silver surface plasmons." Physical Review B 60.16 (1999): 11564.
Gu, Xuefeng, et al. "Light-emitting diodes enhanced by localized surface plasmon resonance." Nanoscale research letters 6.1 (2011): 199.
Hall, Robert N., et al. "Coherent light emission from GaAs junctions." Physical Review Letters 9.9 (1962): 366.
Hanson, Frank, and Stojan Radic. "High bandwidth underwater optical communication." Applied optics 47.2 (2008): 277-283.
Held, G., "Introduction to light emitting diode technology and applications," CRC Press, Taylor & Francis Group, (2008).
Henson, John, et al. "Controlling the recombination rate of semiconductor active layers via coupling to dispersion-engineered surface plasmons." JOSA B 25.8 (2008): 1328-1335.
Hill, Martin T., et al. "Lasing in metallic-coated nanocavities." Nature Photonics 1.10 (2007): 589-594.
Holonyak Jr, Nick, and S. F. Bevacqua. "Coherent (visible) light emission from Ga (As1—xPx) junctions." Applied Physics Letters 1.4 (1962): 82-83.
Hryciw, Aaron, Young Chul Jun, and Mark L. Brongersma. "Plasmonics: Electrifying plasmonics on silicon." Nature materials 9.1 (2010): 3-4.
Jacob, Z. & Shalaev, V. M. "Plasmonics goes quantum". Science 334, 463-464 (2011).
Jacob, Z. et al. "Engineering photonic density of states using metamaterials". Appl. Phys. B 100, 215-218 (2010).
Jacob, Zubin, Leonid V. Alekseyev, and Evgenii Narimanov. "Optical Hyperlens: Far-field imaging beyond the diffraction limit." arXiv preprint physics/0607277.
Kao, C. C., et al. "Localized surface plasmon-enhanced nitride-based light-emitting diode with Ag nanotriangle array by nanosphere lithography." IEEE Photonics Technology Letters 22.13 (2010): 984-986.
Kim, J. et al. "Improving the radiative decay rate for dye molecules with hyperbolic metamaterials". Opt. Express 20, 8100-8116 (2012).
Kinkhabwala, Anika, et al. "Large single-molecule fluorescence enhancements produced by a bowtie nanoantenna." Nature Photonics 3.11 (2009): 654-657.
Kneipp, Katrin, et al. "Single molecule detection using surface-enhanced Raman scattering (SERS)." Physical review letters 78.9 (1997): 1667.
Krishnamoorthy, H. N. S., Jacob, Z., Narimanov, E., Kretzschmar, I. & Menon, V. M. "Topological transitions in metamaterials". Science 336, 205-209 (2012).
Kwon, Min-Ki, et al. "Surface-plasmon-enhanced light-emitting diodes." Advanced Materials 20.7 (2008): 1253-1257.
Lakowicz, J. R. "Radiative decay engineering 5: metal-enhanced fluorescence and plasmon emission". Anal. Biochem. 337, 171-194 (2005).
Lal, Surbhi, Stephan Link, and Naomi J. Halas. "Nano-optics from sensing to waveguiding." Nature photonics 1.11 (2007): 641-648.
Li, Jensen, and J. B. Pendry. "Hiding Under the Carpet: a New Strategy for Cloaking." arXiv preprint arXiv:0806.4396 (2008).
Lin, J., et al. "Surface plasmon enhanced UV emission in AlGaN/GaN quantum well." Applied Physics Letters 97.22 (2010): 221104.
Liu, Z., Lee, H., Xiong, Y., Sun, C. & Zhang, X. "Far-field optical hyperlens magnifying sub-diffraction-limited objects". Science 315, 1686-1701 (2007).
Liu, Zhaowei, et al. "Far-field optical superlens." Nano Letters 7.2 (2007): 403-408.
Liu, Zhaowei, et al. "Rapid growth of evanescent wave by a silver superlens." Applied Physics Letters 83.25 (2003): 5184-5186.

(56) References Cited

OTHER PUBLICATIONS

Logeeswaran, V. J., et al. "Ultrasmooth silver thin films deposited with a germanium nucleation layer." Nano letters 9.1 (2008): 178-182.
Lu, D. & Liu, Z. "Hyperlenses and metalenses for far-field super-resolution imaging". Nature Commun. 3, 1205 (2012).
Lu, Dylan et al. "Enhancing spontaneous emission rates of molecules using nanopatterned multilayer hyperbolic metamaterials". Nature Nanotechnology, vol. 9. Macmillan Publishers Limited, Jan. 2014. pp. 14-53.
Lu, Feng, et al. "Low-cost medium-range optical underwater modem: short paper." Proceedings of the Fourth ACM International Workshop on UnderWater Networks. ACM, 2009.
Lu, Wei, et al. "Effects of surface micromesas on reverse leakage current in InGaN/GaN Schottky barriers." Journal of Applied Physics 112.4 (2012): 044505.
Lu, Wei, et al. "InGaN/GaN Schottky diodes with enhanced voltage handling capability for varactor applications." IEEE Electron Device Letters 31.10 (2010): 1119-1121.
Ma, Changbao, and Zhaowei Liu. "A super resolution metalens with phase compensation mechanism." Applied Physics Letters 96.18 (2010): 183103.
Ma, Changbao, and Zhaowei Liu. "Designing super-resolution metalenses by the combination of metamaterials and nanoscale plasmonic waveguide couplers." Journal of Nanophotonics 5.1 (2011): 051604-051604.
Ma, Changbao, and Zhaowei Liu. "Focusing light into deep subwavelength using metamaterial immersion lenses." Optics express 18.5 (2010): 4838-4844.
Ma, Changbao, Marco A. Escobar, and Zhaowei Liu. "Extraordinary light focusing and Fourier transform properties of gradient-index metalenses." Physical Review B 84.19 (2011): 195142.
MacDonald, Kevin F., et al. "Ultrafast active plasmonics." Nature Photonics 3.1 (2009): 55-58.
Nakamura, Shuji, Takashi Mukai, and Masayuki Senoh. "Candela-class high-brightness InGaN/AlGaN double-heterostructure blue-light-emitting diodes." Applied Physics Letters 64.13 (1994): 1687-1689.
Nathan, Marshall I., et al. "Stimulated emission of radiation from GaAs p-n junctions." Applied Physics Letters 1.3 (1962): 62-64.
Nezhad, Maziar P., et al. "Room-temperature subwavelength metallo-dielectric lasers." Nature Photonics 4.6 (2010): 395-399.
Ni, X. et al. "Effect of metallic and hyperbolic metamaterial surfaces on electric and magnetic dipole emission transitions". Appl. Phys. B 103, 553-558 (2011).
Nie, Shuming, and Steven R. Emory. "Probing single molecules and single nanoparticles by surface-enhanced Raman scattering." science 275.5303 (1997): 1102-1106.
Noginov, M. A., et al. "Demonstration of a spaser-based nanolaser." Nature 460.7259 (2009): 1110-1112.
Okamoto, K. et al. "Surface-plasmon-enhanced light emitters based on InGaN quantum wells". Nature Mater. 3, 601-605 (2004).
Okamoto, Koichi, and Yoichi Kawakami. "High-efficiency InGaN/GaN light emitters based on nanophotonics and plasmonics." IEEE Journal of selected topics in quantum electronics 15.4 (2009): 1199-1209.
Okamoto, Koichi, et al. "Surface plasmon enhanced spontaneous emission rate of InGaN/GaN quantum wells probed by time-resolved photoluminescence spectroscopy." Applied Physics Letters 87.7 (2005): 071102.
Okamoto, Koichi, et al. "Surface-plasmon-enhanced light emitters based on InGaN quantum wells." Nature materials 3.9 (2004): 601-605.
Paiella, Roberto. "Tunable surface plasmons in coupled metallo-dielectric multiple layers for light-emission efficiency enhancement." Applied Physics Letters 87.11 (2005): 111104.
Pendry, J. B., and S. Anantha Ramakrishna. "Refining the perfect lens." Physica B: Condensed Matter 338.1 (2003): 329-332.
Pendry, John Brian. "Negative refraction makes a perfect lens." Physical review letters 85.18 (2000): 3966.
Purcell, E. M. "Spontaneous emision probabilities at radio frequencies". Phys. Rev. 69, 681 (1946).
Quist, Ted M., et al. "Semiconductor maser of GaAs." Applied Physics Letters 1.4 (1962): 91-92.
Raether, "Surface Plasmons on Smooth and Rough Surfaces and on Gratings," Springer-Verlag, New York, 1988.
Ryou, Jae-Hyun, and Russell D. Dupuis. "Focus issue: Optics in LEDs for lighting." Optics express 19 (2011): A897-9.
Salandrino, Alessandro, and Nader Engheta. "Far-field subdiffraction optical microscopy using metamaterial crystals: Theory and simulations." Physical Review B 74.7 (2006): 075103.
Schnitzer, I., et al. "30% external quantum efficiency from surface textured, thin-film light-emitting diodes." Applied Physics Letters 63.16 (1993): 2174-2176.
Schuller, J. A. et al. "Plasmonics for extreme light concentration and manipulation". Nature Mater. 9, 193-204 (2010).
Schurig, David, et al. "Metamaterial electromagnetic cloak at microwave frequencies." Science 314.5801 (2006): 977-980.
Selanger, K. A., Falnes, J. & Sikkeland, T. "Fluorescence lifetime studies of Rhodamin 6G in methanol". J. Phys. Chem. 81, 1960-1963 (1977).
Shalaev, Vladimir M. "Optical negative-index metamaterials." Nature photonics 1.1 (2007): 41-48.
Shelby, Richard A., David R. Smith, and Seldon Schultz. "Experimental verification of a negative index of refraction." science 292.5514 (2001): 77-79.
Shimizu, K. T., Woo, W. K., Fisher, B. R., Eisler, H. J. & Bawendi, M. G. "Surface-enhanced emission from single semiconductor nanocrystals". Phys. Rev. Lett. 89, 117401 (2002).
Smith, David R., John B. Pendry, and Mike CK Wiltshire. "Metamaterials and negative refractive index." Science 305.5685 (2004): 788-792.
Soukoulis, Costas M., and Martin Wegener. "Optical metamaterials—more bulky and less lossy." Science 330.6011 (2010): 1633-1634.
Soukoulis, Costas M., Stefan Linden, and Martin Wegener. "Negative refractive index at optical wavelengths." Science 315.5808 (2007): 47-49.
Stockman, Mark I. "The spaser as a nanoscale quantum generator and ultrafast amplifier." J. Opt 12.024004 (2010): 024004.
Stockman, Mark I. "Ultrafast nanoplasmonics under coherent control." New Journal of Physics 10.2 (2008): 025031.
Stringari, C. et al. "Phasor approach to fluorescence lifetime microscopy distinguishes different metabolic states of germ cells in a live tissue". Proc. Natl Acad. Sci. USA 108, 13582-13587 (2011).
Tumkur, T. et al. "Control of spontaneous emission in a volume of functionalized hyperbolic metamaterial". Appl. Phys. Lett. 99, 151115 (2011).
Valentine, Jason, et al. "An optical cloak made of dielectrics." Nature materials 8.7 (2009): 568-571.
Valentine, Jason, et al. "Three-dimensional optical metamaterial with a negative refractive index." nature 455.7211 (2008): 376-379.
Vasilescu, Iuliu, Carrick Detweiler, and Daniela Rus. "AquaNodes: an underwater sensor network." Proceedings of the second workshop on Underwater networks. ACM, 2007.
Vasilescu, Iuliu, et al. "Data collection, storage, and retrieval with an underwater sensor network." Proceedings of the 3rd international conference on Embedded networked sensor systems. ACM, 2005.
W.C. Pei and T. Li, *Lightwave Communications Technology: Part C*, Semiconductors and Semimetals, edited by W.T. Tsang, 1985, vol. 22, p. 281.
Wang, J., Chabanov, A. A., Lu, D. Y., Zhang, Z. Q. & Genack, A. Z. "Dynamics of mesoscopic fluctuations of localized waves". Phys. Rev. B 81, 241101 (2010).
Yang, X., Yao, J., Rho, J., Yin, X. & Zhang, X. "Experimental realization of three-dimensional indefinite cavities at the nanoscale with anomalous scaling laws". Nature Photon. 6, 450-454 (2012).
Yeshchenko, Oleg A., et al. "Size-dependent surface-plasmon-enhanced photoluminescence from silver nanoparticles embedded in silica." Physical Review B 79.23 (2009): 235438.
Yu, P., et al., "GaAs Optoelectronic Device Technology," in: *Introduction to Semiconductor Technology: GaAs and Related Compounds*, Ed., Cheng T. Wang, Wiley Interscience, New York, (1990), pp. 436-511.

(56) References Cited

OTHER PUBLICATIONS

Zhang, X. & Liu, Z. "Superlenses to overcome the diffraction limit". Nature Mater. 7, 435-441 (2008).
Zhao, Hongping, et al. "Surface plasmon dispersion engineering via double-metallic Au/Ag layers for III-nitride based light-emitting diodes." Applied Physics Letters 98.15 (2011): 151115.
Zheludev, N. I. & Kivshar, Y. S. "From metamaterials to metadevices". Nature Mater. 11, 917-924 (2012).

* cited by examiner

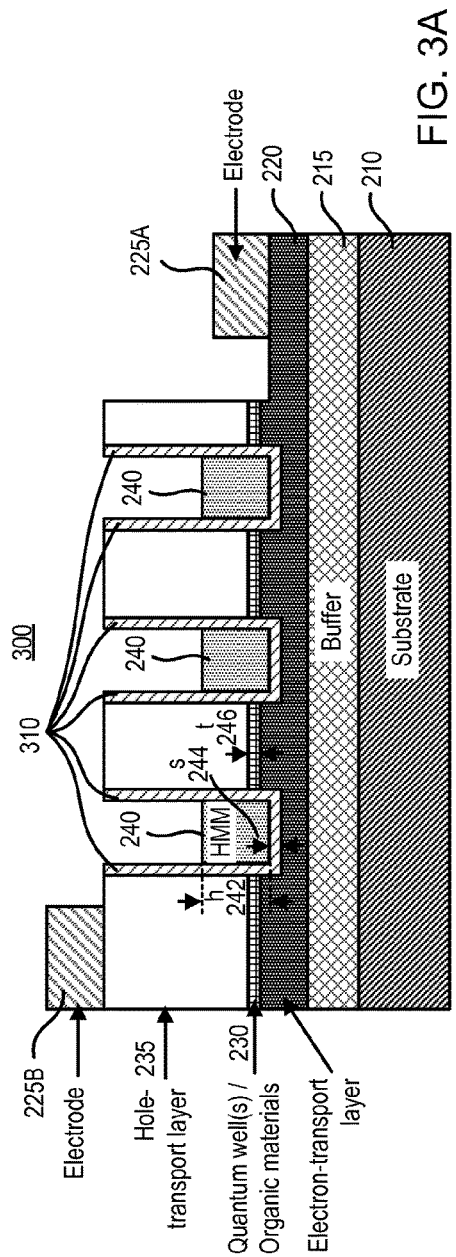
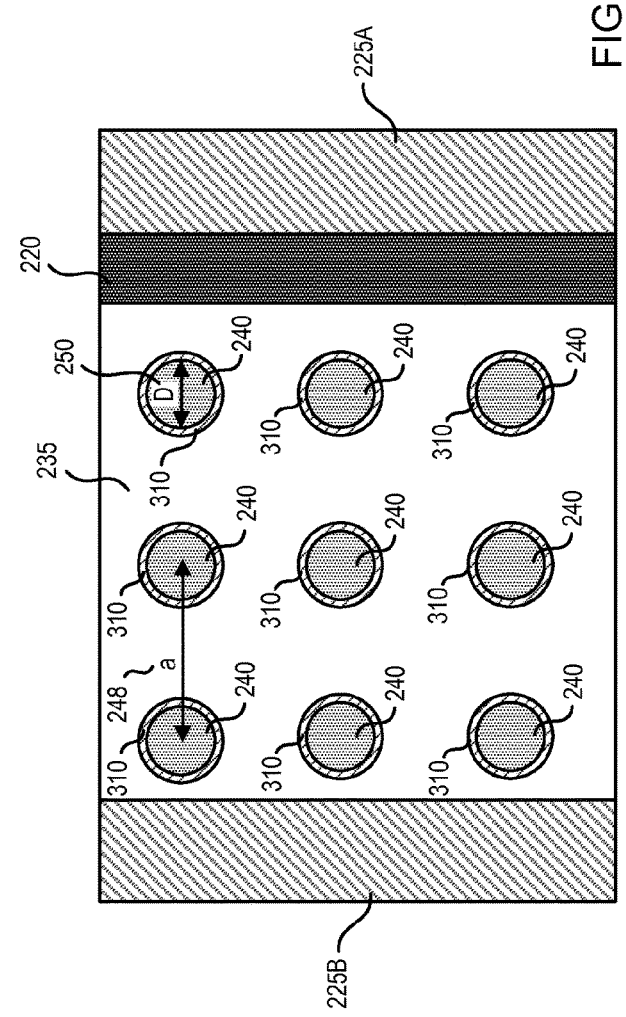

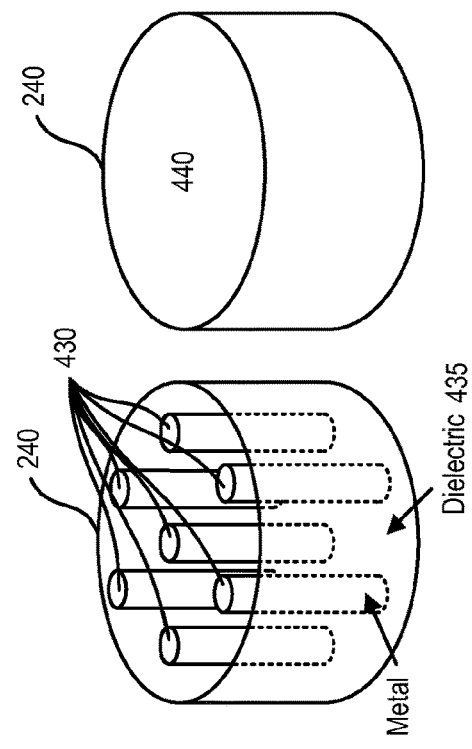
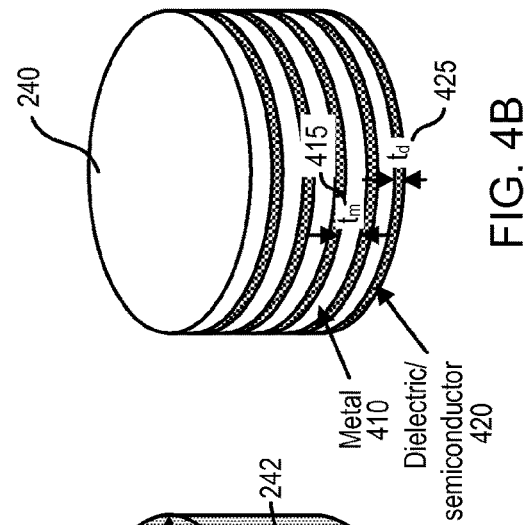
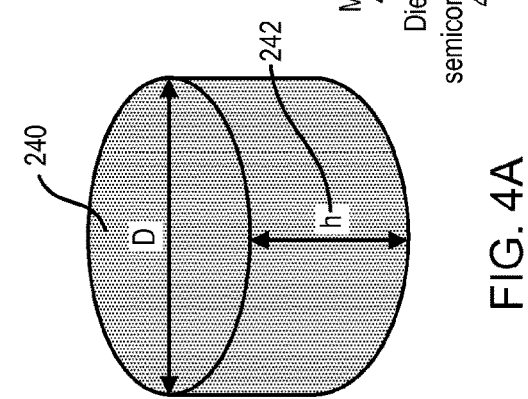
FIG. 4A  FIG. 4B  FIG. 4C  FIG. 4D

ULTRAFAST LIGHT EMITTING DIODES FOR OPTICAL WIRELESS COMMUNICATIONS

CROSS REFERENCE TO RELATED APPLICATIONS

This application is a continuation of U.S. patent application Ser. No. 15/128,723, entitled "ULTRAFAST LIGHT EMITTING DIODES FOR OPTICAL WIRELESS COMMUNICATIONS," filed Sep. 23, 2016, which is a national-phase entry of Patent Cooperation Treaty Application No. PCT/US2015/023192, entitled "ULTRAFAST LIGHT EMITTING DIODES FOR OPTICAL WIRELESS COMMUNICATIONS," which has an international filing date of Mar. 27, 2015, and claims priority to U.S. Provisional Patent Application 61/971,444 filed Mar. 27, 2014, entitled "ULTRAFAST BLUE AND GREEN LEDS FOR UNDERWATER OPTICAL WIRELESS COMMUNICATIONS," the contents of which are hereby incorporated by reference in their entirety.

STATEMENT OF GOVERNMENT SPONSORED SUPPORT

Certain aspects of the subject matter described herein were developed with U.S. Government support under Grant Nos. N00014-13-1-0535 and/or N00014-13-0535 awarded by Office of Naval Research. The U.S. Government has certain rights in the invention.

FIELD

The subject matter disclosed herein relates to optical wireless communications.

BACKGROUND

With the proliferation of wireless handheld devices and the data handling capability of these devices, the bandwidth required to support their use has continuously increased over the last decade. As more personal data is being communicated with wireless devices, privacy is an ever increasing concern. Moreover, some environments are inhospitable to radio frequency wireless communications such as underwater communications. In these environments, high data rates may not be supportable using radio frequency or acoustic communications. Optical communications may provide solutions to these problems.

Light emitting diodes (LEDs) and organic light emitting diodes (OLEDs) directly convert electronically modulated signals into optically modulated signals and play essential role in short-haul optical wireless communication links. Improving the modulation speed and the quantum efficiency of LEDs have been roadblocks to achieving better optical wireless communications systems. In the past, photonic crystals and roughened surfaces have been used to increase both the brightness and the modulation speed of LEDs.

SUMMARY

Methods and apparatus, including computer program products, are provided for LEDs and OLEDs including wavelengths from ultraviolet to near infrared. In some example embodiments there is provided an apparatus. The apparatus may include a plurality of layers including a substrate layer, a buffer layer disposed on the substrate layer, a charge transport layer, a light emission layer, another charge transport layer, and/or a metamaterial layer. The charge transport layer may be disposed on the buffer layer. The charge transport layer may include a doped semiconductor in electrical contact with at least an electrode. The light emission layer may be disposed on the charge transport layer. The other charge transport layer may be disposed on the light emission layer. The other charge transport layer may have at least one channel etched into the other charge transport layer, wherein the at least one channel is etched through the other charge transport layer to leave a residual thickness of the other charge transport layer between a bottom of the etched channel and the light emission layer. Another electrode may be in electrical contact with the other charge transport layer. The metamaterial layer may be contained in the at least one channel. The metamaterial layer may be proximate to the residual thickness of the other charge transport layer. The metamaterial may include a structure including at least one of a dielectric or a metal.

In some variations, one or more of the features disclosed herein including the following features can optionally be included in any feasible combination. The structure of the metamaterial may include a stack of alternating layers of dielectric and metal. The structure of the metamaterial may include a dielectric with at least one rod of the metal running through the dielectric. The structure of the metamaterial may include only metal. A cross section of the structure may have a shape including at least one of a circle, a square, a rectangle, a hexagon, or an octagon or any other shape. The apparatus may include a plurality of periodically spaced channels with corresponding metamaterial contained in the plurality of channels. The apparatus may further include an insulating layer surrounding the metamaterial, wherein the channel is etched through the charge transport layer, through the light emission layer, and into the other charge transport layer. The charge transport layer may be an n-type semiconductor and the other charge transport layer may be a p-type semiconductor, or the charge transport layer may be the p-type semiconductor and the other charge transport layer may be the n-type semiconductor. The reduced recombination lifetime in the light emission layer may be between 1 picosecond and 1 nanosecond. The metamaterial and the structure may cause a reduced recombination lifetime in the light emission layer when compared to the apparatus without the metamaterial, wherein the reduced recombination lifetime causes an increased speed of adjusting an output optical intensity of the apparatus. The increased speed of adjusting the optical intensity of the apparatus may be 1 GHz or higher. The apparatus may be modulated according to a stream of digital information at a data rate of 1 to 10 gigabits per second or higher. The electrode and the other electrode may be a metal, the hole transport layer may be a p-type semiconductor, the electron transport layer may be a n-type semiconductor, the buffer layer may assist semiconductor growth, the light emission layer may have a composition comprising a semiconductor p-n junction or a plurality of quantum wells or a plurality of quantum dots or a plurality of emissive organic materials, and the substrate may have a composition including a semiconductor or an oxide or a plastic.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

The above-noted aspects and features may be implemented in systems, apparatuses, methods, and/or computer-readable media depending on the desired configuration. The details of one or more variations of the subject matter described herein are set forth in the accompanying drawings and the description below. Features and advantages of the subject matter described herein will be apparent from the description and drawings, and from the claims.

DESCRIPTION OF THE DRAWINGS

The accompanying drawings, which are incorporated in and constitute a part of this specification, show certain aspects of the subject matter disclosed herein and, together with the description, help explain some of the principles associated with the subject matter disclosed herein. In the drawings.

FIGS. 3A-3B depict another example of an ultrafast light emitting diode apparatus, in accordance with some example implementations;

FIGS. 4A-4D depict examples of metamaterial structures, in accordance with some example implementations.

Figure 1:
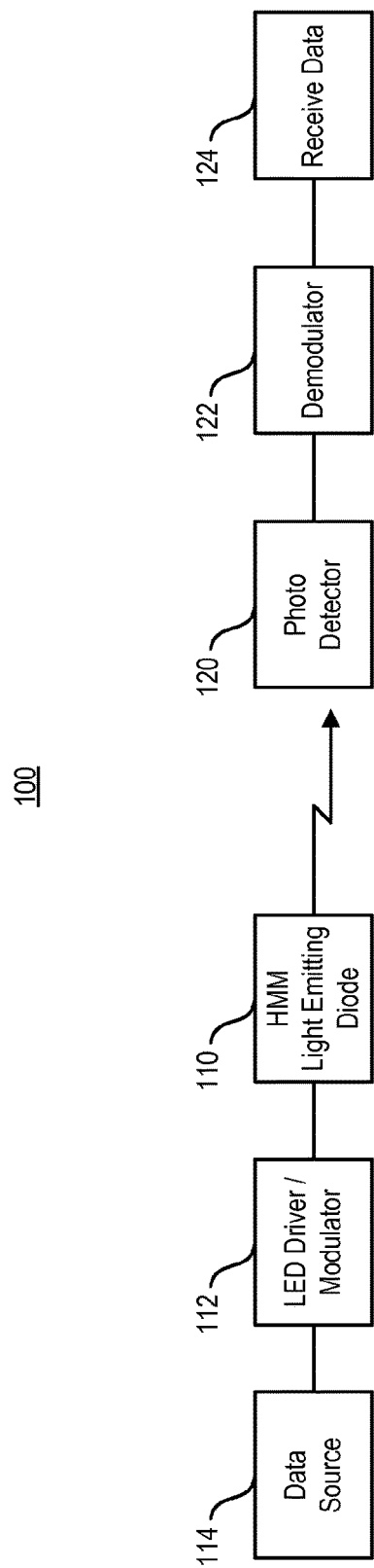
FIG. 1 depicts an example of an optical communication system block diagram, in accordance with some example implementations.

Like labels are used to refer to same or similar items in the drawings.

DETAILED DESCRIPTION

The subject matter disclosed herein relates to light emitting diodes (LEDs) and organic light emitting diodes (OLEDs) that can be modulated at ultrafast rates for application in high-speed optical wireless communications. For example, a light emitting diode is disclosed where the speed of modulation of the emitted light is increased by introducing optical metamaterials into the structure of the light emitting diode. In some example embodiments, ultrafast LEDs are disclosed whose optical output may be controlled electrically at frequencies of 10 GHz or higher, although ultrafast LEDs can be used at other rates as well.

Metamaterials may include artificial materials that may be designed for a predetermined working wavelength to improve the modulation speed of LEDs. Additionally, the geometry of the metamaterial has a potential to enhance external quantum efficiency. The fabrication processes of the metamaterials disclosed herein and LEDs disclosed herein are compatible allowing integration of the fabrication of metamaterial enhanced LEDs.

Optical metamaterials may modify the light emitting process of a light-emitting diode (LED) when the optical metamaterial is placed in the vicinity of the light emitting region of the LED due to interaction between the LED and the metamaterial. The interaction may result in higher LED switching speeds and/or higher efficiency. The resulting ultrafast light intensity may be modulated by ultrafast/radio frequency electronics. This subject matter disclosed herein may include light emitting diodes that include metamaterials resulting in improved modulation speed and quantum efficiency.

A metamaterial may include one or more layers of metal and dielectric (or semiconductor), or in some embodiments, pure metals and/or metallic nano-composites. Due to near field electromagnetic coupling between the metamaterial and one or multiple light emission layers of an LED, more surface modes (or surface plasmons) may appear in the metamaterial leading to an enhancement in the photonic density of state (PDOS). In some example embodiments, ultrafast LEDs may have one or more of the following features: 1) The lifetime of surface plasmons (SP) supported in the metamaterials may be short so that the SP excitation process is fast (at the scale of 10-100 fs); 2) metamaterials may have high PDOS at predetermined frequencies, so that the excited or injected electrons transfer their energy to SPs with high efficiencies; and 3) structures that can couple SPs into propagating light through a scattering process with high efficiency and high speed.

In some example embodiments, the refractive index and the thickness of the dielectric layer can be determined to achieve a higher density of states or Purcell factor at predetermined wavelengths by tuning the coupling between metallic layers.

In some example embodiments, efficient quantum-well (QW) coupling to the metamaterial may lead to performance improvement. In some example embodiments, the metamaterial does not have to be present across the entirety of the near field of the QW region. In some example embodiments, efficient QW-metamaterial coupling occurs when the first few metallic layers of the metamaterial are in the near field of the QW layer. The SPs in the first few layers of the metamaterial may be coupled into the rest of the metal films through a SP-SP coupling. Even when the topmost layers of metal are quite far from the dipole, the SPs in topmost layers can be efficiently excited by SP-SP coupling.

LEDs including metamaterials may be configured to achieve an optimized SP DOS and Purcell factor that is consistent with predetermined LED working wavelengths. The optimization parameters include the selection of composite materials as well as the geometries of the materials. The metamaterial and geometry may be configured to cause the out-coupling structure to improve the external quantum efficiency.

FIG. 1 depicts an example block diagram of an optical communication system, in accordance with some example embodiments. Data source 114 may provide information to be transmitted by the optical communication system 100. LED modulator/driver 112 may generate an electrical signal to drive a hyperbolic metamaterial light emitting diode (HMM-LED) 110 to produce an optical intensity that varies with time according to the electrical signal. The optical intensity may represent the information. The optical signal from the HMM-LED may impinge on photodetector 120 causing an electrical signal to be generated according to the incident light intensity. Demodulator 122 may recover the transmitted information as received data 124.

Data source 114 may provide information to be transmitted by the optical communication system 100. For example, data source 114 may include any kind of digital or analog data source. For example, data source 114 may include binary data corresponding to digitized video, and/or data source 114 may include an analog signal such as analog voice signals from a microphone.

LED modulator 112 may generate an electrical signal to drive hyperbolic metamaterial light emitting diode (HMM- LED) 110 to produce an optical intensity that varies with time according to the electrical signal. The optical intensity may represent the information from data source 114. For example, LED modulator 112 may drive the HMM-LED to carry a 10 Gigabit-per-second (GBPS) binary data stream from data source 114, although the HMM-LED may operate at other rates as well. The HMM-LEDs disclosed herein enable high-speed optical communications.

The optical signal from the HMM-LED may impinge on photodetector 120 causing an electrical signal to be generated according to the incident light intensity. Continuing the previous example, a 10 GBPS optical signal may be detected at photodetector 120. Demodulator 122 may then recover the transmitted information as received data 124.

Figure 2A:
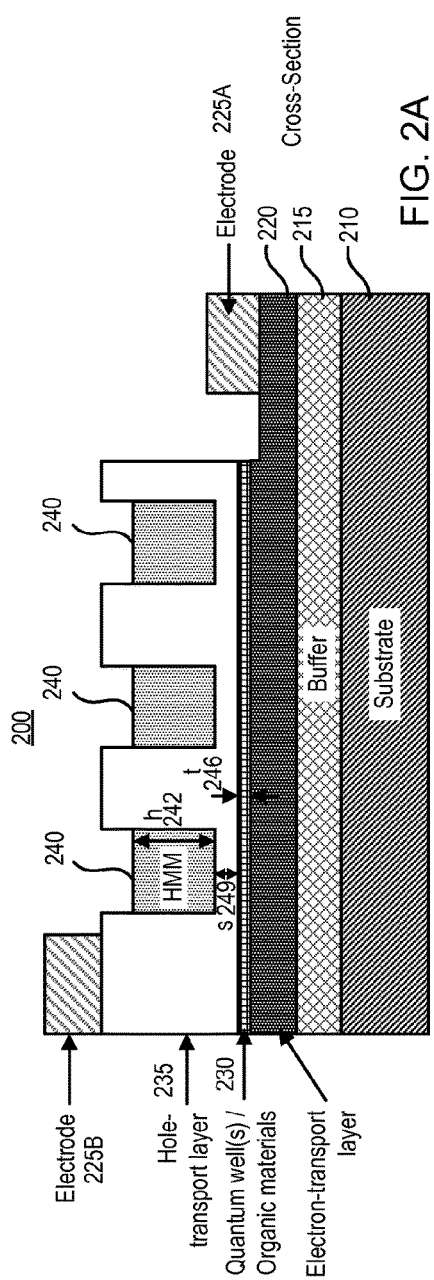
FIGS. 2A-2B depict an example of an ultrafast light emitting diode apparatus, in accordance with some example implementations.

FIG. 2A depicts an example of a structure for a hyperbolic metamaterial light emitting diode (HMM-LED), in accordance with some example embodiments. The HMM-LED 200 may be a semiconductor device that when completed includes a series of layers. For example, an HMM-LED may include a substrate layer 210, a buffer layer 215, an electron transport layer 220, a quantum-well or multiple quantum-well layer 230, a hole transport layer 235, electrodes 225A and 225B, and at least one hyperbolic metamaterial region 240. Additional or fewer layers may also be implemented. In some example embodiments, the HMM-LED 200 layers may be produced using semiconductor and/or integrated circuit device fabrication processes.

Substrate layer 210 may be any type of substrate material compatible with the processes needed to deposit the other HMM-LED layers. For example, substrate materials may include GaN (gallium nitride), GaP (gallium phosphide), GaAs (gallium arsenide), InP (indium phosphide), Si (silicon), SiO2 (silicon dioxide), sapphire, Ge (germanium), flexible plastic such as polyethylene terephthalate (PET), or any other substrate material. Buffer layer 215 materials may include undoped GaN, undoped GaP, AlN, GaAs, or other materials. Electron transport layer 220 materials may include an n-doped semiconductor, and hole transport layer 235 may include a p-doped semiconductor. As examples, Si may be doped with group V elements to make n-doped silicon, or silicon may be doped with group III elements to make p-doped silicon. GaN may be doped with Si to make n-doped GaN, or GaN may be doped with Mg to make p-doped GaN. AlGaN may be doped with Si to make n-doped AlGaN, or AlGaN may be doped with Mg to make p-doped AlGaN. GaP may be doped with sulfur to make n-doped GaP, or GaP may be doped with zinc to make p-doped GaP. GaAs may be doped with Si to make n-doped GaAs, or GaAs may be doped with Be or Mg to make p-doped GaAs. For OLEDs, NPB (N,N'-bis-(1-naphthl)-diphenyl-1,1'-biphenyl-4,4'-diamine) may be used as the hole transport layer, and CsPh (Cs2CO3 doped 4,7-diphenyl-1,10-phenanthroline) may be used as the electron transport layer. Quantum-well layer 230 may include thin layers of materials with alternating band gaps. For example, alternating layers of indium gallium nitride sandwiched with gallium nitride. Quantum-well layer 230 may include alternating layers of GaNP sandwiched with GaP. It may include alternating layers of AlGaN sandwiched with n-AlGaN. Quantum-well layer 230 may include alternating layers of AlGaAs sandwiched with GaAs. For OLEDs, the emission layer may include AlQ (tris (8-hydroxyquinolinc) aluminum). The thicknesses of the quantum well layers may be comparable to the de Broglie wavelength of the holes and electrons. In the example of FIG. 2A, the quantum well layer includes several cycles of the alternating layers with a total thickness of t 246. Electrodes 225A and 225B may have a composition of more metals, such as gold.

In some example embodiments, GaN/InGaN materials may be used to produce LEDs in the blue wavelength range, although other wavelengths may be implemented as well. For example, InGaN—GaN multiple quantum well wafers may be grown on (0001) oriented sapphire substrates. The layers may include a n-type GaN (3.22 μm) buffer layer, 5 periods of QWs (InGaN: 2 nm, GaN: 10 nm), followed by a p-GaN cap layer (100 nm). In some example embodiments, the carrier concentration for n-GaN and p-GaN may be $\sim 5 \times 10^{18}$ cm$^{-3}$ and $\sim 8 \times 10^{17}$ cm$^{-3}$, respectively.

The speed and/or efficiency of the HMM-LEDs may be improved by including hyperbolic metamaterial (HMM) regions in the hole transport layer 235. In some example embodiments, channels may be etched in the hole transport layer to locate the HMM region. For example, channels in the hole transport layer may be etched through the hole transport layer to leave a thickness, s 249, of hole transport layer between the HMM region and the quantum well layer. Thickness s 249 may be referred to as a residual thickness. In some embodiments, the residual thickness is between 5 and 50 nm. The HMM regions affect other aspects of the HMM-LED as well. The plasmonic modes supported by the HMM possess a high density of states and short lifetimes, representing a fast decay channel compared to the conventional light emission channel through electron-hole recombination. Therefore, a majority of the electrical energy will be converted to surface plasmon waves in HMM and then scattered into propagating photons. This light emission process is much faster and may also have higher efficiency.

One or more HMM regions 240 may be located throughout the hole transport layer 235. As described below with respect to FIGS. 4A-4D and 5A-5D, HMM regions 240 may include alternating closely spaced layers of metal and dielectric (or semiconductor), nanowires in a dielectric material, or a metal layer.

Figure 2B:
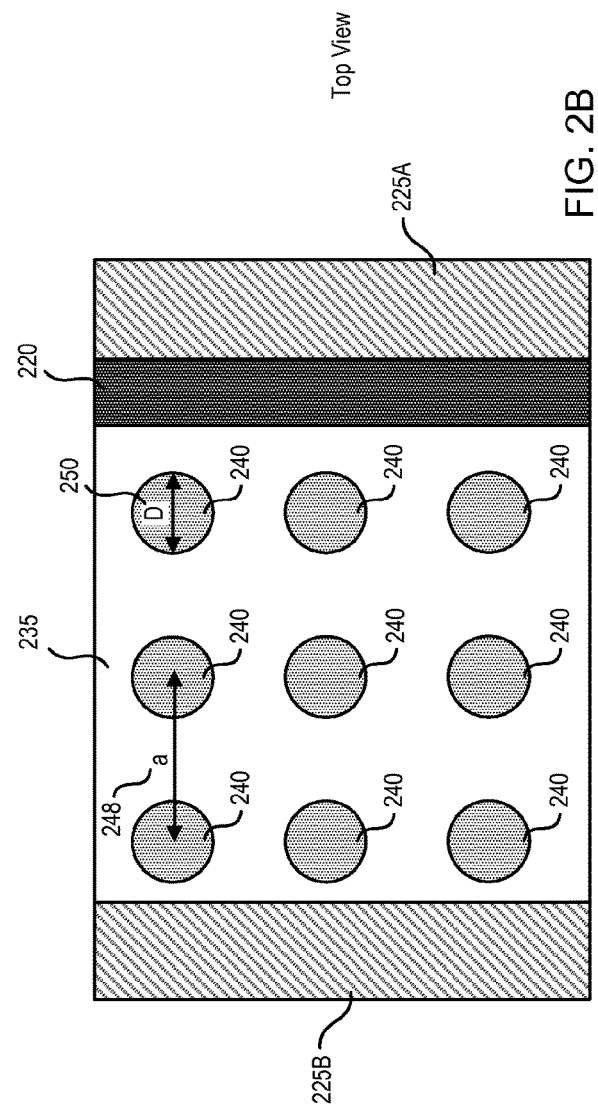

FIG. 2B depicts an example of a top view of a structure for an HMM-LED. FIG. 2B corresponds to a top view of the example HMM LED 200 in FIG. 2A. Shown on the right and left sides are electrodes 225A and 225B for electrical contact. Current being caused to pass from one electrode to another causes light emission from the HMM-LED 200. Electron transport layer 220 is seen from the top next to electrode 225A as shown in FIG. 2A. Hole transport layer 235 is shown in FIG. 2B between electrode 225B and electron transport layer 220. Placed at periodic intervals (or aperiodic intervals) in the hole transport layer 235 are HMM regions 240. The channels in the hole transport layer 235 and the corresponding HMM regions 240 may take on a variety of cross-sectional shapes such as circular, square, hexagonal, octagonal, or any other shape. For example, HMM regions 240 in FIGS. 2A and 2B are circular when viewed from above (cylindrical in three dimensions). In some example embodiments, the HMM regions have diameter D 250, and are spaced periodically with center-to-center separation a 248. Although FIG. 2B shows the HMM regions 240 spaced periodically, they may be placed aperiodically as well. In some example embodiments of FIG. 2B (or FIG. 2A), hole transport layer 235 and electron transport layer 220 may be swapped. For example, channels may be provided leaving thickness s 249 of electron transport layer 220 between HMM 204 regions and quantum well layer 230.

TABLE 1

| Parameter | GaN LED (530 nm light output) | GaN LED (460 nm light output) |
| --- | --- | --- |
| a | 200 nm | 200 |
| D | 100 nm | 80 |
| h | 100 nm | 20 |
| s | 10 nm | 10 |
| t | 40 nm | 40 |
| Hyperbolic Metamaterial | Alternating Si and Ag layers (Ag volumetric filling ratio: 85%) | Metal |

Table 1 depicts example values for an HMM-LED, in accordance with some example embodiments. Table 1 shows example values for a, D, h, s, t, and type of metamaterial for gallium nitride LEDs that produce 530 nm light output and 460 nm light output. Different values for a, D, h, s, t, and the metamaterial layer thicknesses may be used for OLEDs or LEDs produced using other materials.

FIG. 3A depicts another example of a structure for a hyperbolic metamaterial light emitting diode (HMM-LED), in accordance with some example embodiments. FIG. 3A differs from the structure of the HMM-LED in FIG. 2A in the following ways: a) the channels to locate the HMM regions are etched through the hole transport layer 235, through the quantum well layer 230, and partially through the electron transport layer 220, and b) an isolation layer 310 is added between the HMM regions 240 and the surrounding hole transport 235, quantum well 230, and electron transport 220 layers. Isolation layer 310 may include oxides such as Al2O3, SiO2, TiO2 or other insulating materials. In some example embodiments, as depicted in FIG. 3A the HMM region height, h 242, may not fill the entire channel etched into the layers of HMM-LED 300.

FIG. 3B depicts an example top view of the HMM-LED 300 of FIG. 3A. The structure differs from the structure of FIG. 2B in that the isolation layer 310 surrounds the HMM regions 240.

FIG. 4A-4D depict examples of different types of HMM regions, in accordance with some example embodiments. Although FIGS. 4A-4D depict cylindrical shaped HMM regions 240 (circular shape in top view of HMM 200/300), other shapes may also be used such as a rectangular prism, hexagonal prism, octagonal prism, or any other prism.

FIG. 4A depicts an example of a circular HMM region with diameter D 250 and height, h 242. The HMM regions 240 in FIGS. 4A-4D are examples of HMM regions that may be incorporated into the HMM-LEDs of FIGS. 2A-2B and 3A-3B. Although FIGS. 2A-2B (and 3A-3B) show HMM regions 240 that are constructed to be the same, the HMM regions in a HMM-LED 200 (300) could have HMM regions that are different across one LED as well.

FIG. 4B depicts an example of a HMM structure with alternating layers of two materials although any other number of alternating materials may be used as well. In the example of FIG. 4B, metal layer 410 alternates with dielectric/semiconductor layer 420 along the height, h 242, of the HMM region 240. In some example embodiments, the metal layers may be gold or silver or aluminum or another metal. For example, a silver layer may be used with a thickness of 17 nm in an embodiment consistent with the 530 nm LED in Table 1. In some embodiments, the dielectric layer 420 may be silicon with a thickness of 3 nm. The dielectric can be an oxide such as SiO2, Al2O3, TiO2, HFO2, or fluoride such as MgF2, CaF2, or chloride such as NaCl, KCl, or sulfide such as ZnS, PbS, or phosphate such as ADP, KTP, KDP, or selenide such as ZnSe, CdSe, or nitride such as Si3N4, AlN, or niobate such as KNbO3, LiNbO3, or other transparent/semitransparent dielectrics. The semiconductors can be Si, Ge, GaN, GaAs, GaP, or other composite semiconductors.

FIG. 4C depicts an HMM region 240 comprising dielectric material 435 and nanowires 430. For example, in some embodiments, nanowires embedded in a dielectric may be used as a metamaterial. In some example embodiments, nanowire based HMM may be used in HMM-LEDs operating at longer wavelength (e.g. near infrared wavelengths). In some example embodiments, the nanowire may be Ag or other metal. In some example embodiments, the dielectric material may be Al2O3 or other dielectric material.

FIG. 4D depicts an HMM region 240 comprising a metal without the alternating layers of metal and dielectric shown in FIG. 4B. For example, in some embodiments, metal may be used as a metamaterial. In some example embodiments, plain metal may be used at specific operating frequencies that align with the surface plasmon resonance frequencies of the metal. For example, in some embodiments, Ag may be used in GaN based blue LEDs (~460 nm) to enhance the performance. In some example embodiments, Al may be used in LEDs working at UV frequencies.

The external quantum efficiency (EQE) and the light emission speed are two criteria used to evaluate LEDs. The EQE ($\eta e$) value of an LED, which determines the brightness, is given by a product of the light extraction efficiency (Cext) and the internal quantum efficiency (IQE, $\eta i$): $\eta e = \eta i C ext$. The $\eta i$ is governed by $\eta i = \tau/\tau r = \tau nr/(\tau r + \tau nr)$, where $\tau r$ and $\tau nr$ are the radiative and nonradiative lifetimes, and $1/\tau = 1/\tau r + 1/\tau nr$. The effort to improve the performance of LEDs is focused on increasing $\eta e$ and to reducing $\tau$.

To improve the speed of an LED the recombination rate through the Purcell effect may be utilized. The probability of spontaneous emission (SE) is governed by the Fermi's golden rule as $$\Gamma_{ij} \sim |M_{ij}|^2 \rho(\hbar\omega) \quad \text{Equation 1,}$$

where $\Gamma ij$ is the rate for the transition between excited state i and lower-energy state j; Mij is a matrix element that connects the two energy levels; $\rho$ is the photonic density of state (PDOS) at the transition frequency. Spontaneous emission may be enhanced by altering the PDOS. The ratio of enhanced to free space emission is commonly called the Purcell factor F. In some example embodiments, Purcell enhancement may modify the SE rate, leading to both high speed and high efficiency in plasmonic (metamaterial) enhanced LEDs.

When semiconductor emitters are placed in the vicinity of a metallic film, strong quantum electrodynamic coupling to SP modes may occur. The system can be described by a classical model of dipole emission near metal interfaces, in which the emissive layer is considered to be a plane of electric dipole sources of $\mu e^{-\omega t}$ placed at $r = d\hat{z}$ in a medium of dielectric constant $\varepsilon_1$. The power dissipated by this dipole may be given by, $$P = \frac{\omega}{2} \text{Im}(\mu^* \cdot E), \quad \text{Equation 2}$$

where E is the total field as a superposition of the dipole emission field and its reflected field at the dipole location. According to the semi-classical theory of radiation, the SE rate may be expressed as $\Gamma = P/\hbar\omega$. After normalization by the same quantity in the absence of any interfaces ($\Gamma_0$), the Purcell factor F quantifies the SE-rate enhancement defined as, $$F = \frac{\Gamma}{\Gamma_0} = \frac{\Gamma_r + \Gamma_{nr} + \Gamma_{SP}}{\Gamma_r + \Gamma_{nr}} = 1 - \eta_i + \eta_i \frac{P/\hbar\omega}{\Gamma_r}, \quad \text{Equation 3}$$

where r, nr, and SP denote the decay contribution from radiative, non-radiative, and surface plasmon channels, respectively; $\eta_i = \Gamma_r/(\Gamma_r + \Gamma_{nr})$ is the intrinsic IQE; the purely radiative rate is governed by the Larmor formula as $\Gamma_r = |\mu|^2 \sqrt{\varepsilon_1}\omega^3/3\hbar c^3$. For the dipoles perpendicular ($\perp$) or parallel ($\parallel$) to the interfaces, the corresponding F are written as $$F_\perp = 1 - \eta_i + \frac{3}{2}\eta_i Rc \int_0^\infty dk_x \frac{1}{q_1} \left(\frac{k_x}{\sqrt{\varepsilon_1}k_0}\right)^3 [1 + r_p c^{2iq_1 d}], \quad \text{Equation 4}$$

$$F_\square = 1 - \eta_i + \quad \text{Equation 5}$$
$$\frac{3}{4}\eta_i \text{Re} \int_0^\infty dk_x \frac{1}{q_1} \frac{k_x}{\sqrt{\varepsilon_1}k_0} \left\{1 + r_s e^{2iq_1 d} + \frac{q_1^2}{\varepsilon_1 k_0^2}[1 - r_p e^{2iq_1 d}]\right\},$$

$k_x$ is the wave vector along the x axis (parallel to the interfaces); $q_1 = (\varepsilon_1 k_0^2 - k_x^2)^{1/2}$ with its imaginary imaginary part larger than zero and $k_0 = \omega/c$; $r_p$ and $r_s$ are the reflection coefficients for P- and S-polarized waves at the interfaces, calculated by a transfer matrix method. For isotropic orientation, the average enhancement is given by $F_{iso} = (\frac{1}{3})F_\perp + (\frac{2}{3})F_\square$. With the knowledge of the expression for Purcell factor, the QE enhancement $f_\eta$, defined as the ratio of enhanced to intrinsic QE for emitters near the interfaces is defined as $$f_\eta = \left(\text{Re}\int_0^1 dk_x \frac{dP}{dk_x} + C \cdot \text{Re}\int_1^\infty dk_x \frac{dP}{dk_x}\right)/F, \quad \text{Equation 6}$$

where C is the out-coupling coefficient for plasmonic modes; $dP/dk_x$ corresponds to the integrants in Eq. (4) or (5), called the normalized dissipated power spectra.

Hyperbolic metamaterials are highly anisotropic materials that possess different signed permittivities along orthogonal directions. Because at optical frequencies metals and dielectrics have negative and positive permittivities, respectively, hyperbolic metamaterials may be made from metal-dielectric composites. A metamaterial composed of metal-dielectric multilayers is shown in FIG. 4B, and a metamaterial composed of metallic nanowires embedded in a dielectric host is shown in FIG. 4C. When the feature size is much smaller than the working wavelength, the metamaterial can be described by an effective medium approximation. The effective permittivities $\varepsilon_x$, $\varepsilon_y$, and $\varepsilon_z$ in the x, y and z directions can be tuned by the metal filling factor p, and can be calculated by the following equations in 1D multilayer (Equation 7) and 2D nanowire (Equation 8) systems:

$$\begin{cases} \varepsilon_x = \varepsilon_y = p\varepsilon_m + (1-p)\varepsilon_d \\ \varepsilon_z = \left(\frac{p}{\varepsilon_m} + \frac{1-p}{\varepsilon_d}\right)^{-1} \end{cases}, \quad \text{Equation 7}$$

$$\begin{cases} \varepsilon_z = p\varepsilon_m + (1-p)\varepsilon_d \\ \varepsilon_x = \varepsilon_y = \varepsilon_d \frac{(1+p)\varepsilon_m + (1-p)\varepsilon_d}{(1-p)\varepsilon_m + (1+p)\varepsilon_d} \end{cases}. \quad \text{Equation 8}$$

The effective material properties of the metamaterial are determined by selecting appropriate metal-dielectric combinations, filling ratios and working wavelengths. If $\varepsilon_x$ and $\varepsilon_z$ have different signs, the equi-frequency contour (EFC, described by $k_x/\varepsilon_z + k_z/\varepsilon_x = k_0^2$) of the metamaterial becomes hyperbolic. For this reason, this type of metamaterials is referred to as hyperbolic dispersive plasmonic metamaterials (HD-PMMs). The high transverse k-vector coverage may enable light control at nanoscale dimensions using HD-PMMs. Since the HD-PMMs are very dispersive and highly geometry dependent, the working wavelength ranges for multilayer and nanowire systems are ultraviolet to green and green to infrared, respectively. Therefore, an appropriate HD-PMM structure needs to be selected first for applications at a given wavelength region.

The wavelength corresponding to the Purcell factor peak may be tunable, so that different metamaterials may be designed to enhance the LED speed at predetermined working wavelengths. Higher peak enhancement or multiple enhancement peaks are possible. This property may originate from the versatile HMM design approaching to two distinctive pole conditions: (i) $\varepsilon$ parallel to the multilayer→0 and (ii) $\varepsilon$ perpendicular to the multilayer→∞. The enhancement bandwidth can also be tuned by the adjusting metal filling ratio. The same principles can be applied to the nanowire HMMs, leading to the working wavelength shift to longer wavelengths.

However, the Purcell enhancement may lead to diminished radiative emission and thus attenuated QE since the plasmonic modes arc nonradiative in flat metamaterials. In order to achieve both high speed and high EQE, efficient out-coupling structures (e.g. super structured metamaterials) may be used. A numerical method may be used to determine both the Purcell factor and the EQE. After normalization by the radiated power $P_0$ of the same dipole in the absence of any structures, the Purcell factor can be determined by $F = 1 - \eta i + \eta i(Pr + Pnr)/P_0$. The QE enhancement factor on the substrate can also be calculated by $$f_\eta = \eta'/\eta_i = \frac{P_r/P_0}{1 - \eta_i + \eta_i \cdot (P_r + P_{nr})/P_0},$$

which depends on both the radiated power Pr and the intrinsic IQE in free space. The radiated power Pr=P_free+ C·P_PM consists of both the free propagating component and the out-coupled plasmonic modes (PM) when an out-coupler is present. The Purcell enhancement for a flat HMM may exponentially decay as the distance between the dipole and the substrate increases, while for the structured HMM, the SE rate of light emitters may be enhanced by almost two orders of magnitude near the edge of the trench. Due to the strong coupling of light to nonradiative plasmonic modes, light emitters with a high intrinsic IQE may become attenuated when placed on top of the uniform HMM. Large QE enhancement becomes possible for light emitters with low IQE when placed on the HMM with a good out-coupler. In some example embodiments, when $\eta_1 = 1\%$, QE will be enhanced by >10× due to an out-coupling coefficient C=0.3 for the structured HMM compared with diminished QE on the uniform HMM. The structured HMM may achieve enhancement for both SE rate and QE by aligning plasmonic modes better with the emission wavelength. Such enhancement may be difficult using pure silver (Ag) structures with the same out-coupling coefficient since the working wavelength is far off the SP resonances of pure Ag.

The HMMs may be deposited on top of a p-type GaN/MQW structure. The thickness of the p-type GaN spacer layer may be important for the QW-HMM coupling. Two parameters may directly affect the selection of the thickness of the p-GaN layer. First, the SP penetration depth (L) of the SP fringing field into the semiconductor. Generally, the p-GaN layer should be thinner than L to obtain strong SP-QW coupling. In the case of a single metal film, L may be 42 nm when the working wavelength is at 460 nm. Second, the depletion width (D) of the p-side in the p-n junction. The thickness of the p-GaN layer should be larger than D to maintain the p-n junction in LEDs. D can be calculated from $$D = \sqrt{\frac{2\varepsilon V_{bi} N_D}{q N_A (N_A + N_D)}}$$

where $\varepsilon$ is the dielectric constant, $N_D$ is the carrier concentration of the n-GaN layer, $N_A$ is the carrier concentration of the p-GaN layer, and $V_{bi}$ is the built-in voltage $$V_{bi} = \frac{kT}{q} \ln \frac{N_A N_D}{n_i^2},$$

where $n_i$ is the intrinsic carrier concentration. If $N_A$ and $N_D$ is $8 \times 10^{17}$ cm$^{-3}$ and $5 \times 10^{18}$ cm$^{-3}$, respectively, D is estimated to be 32 nm. In some example embodiments, the thickness of the p-GaN layer in a single Ag layer enhanced GaN 460 nm LED is in the range of 32 nm-42 nm. The same principle can also be applied in the HMM-LEDs. However, in the case of HMM, L is may be larger by designing specific HMM property. In addition, a longer operation wavelength also increases the value of L.

Figure 5A:
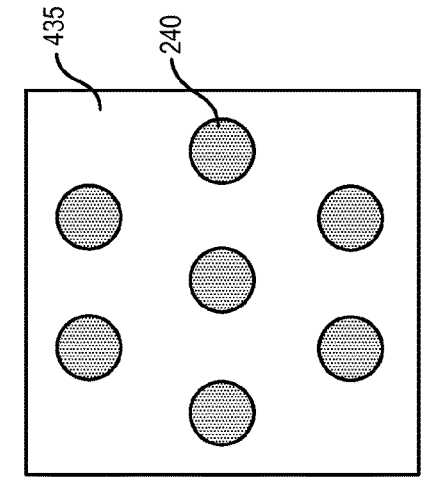
FIGS. 5A-5D depict examples of geometrical arrangements of metamaterial regions in a substrate, in accordance with some example implementation.
Figure 5B:
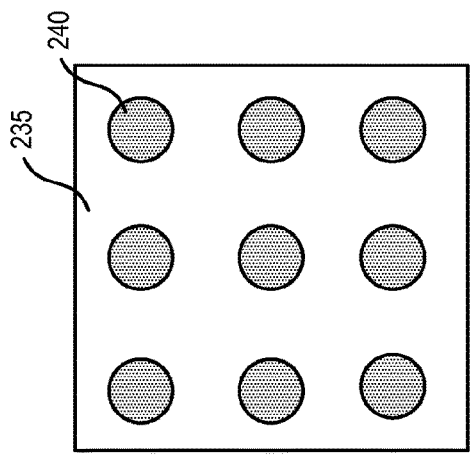
Figure 5C:
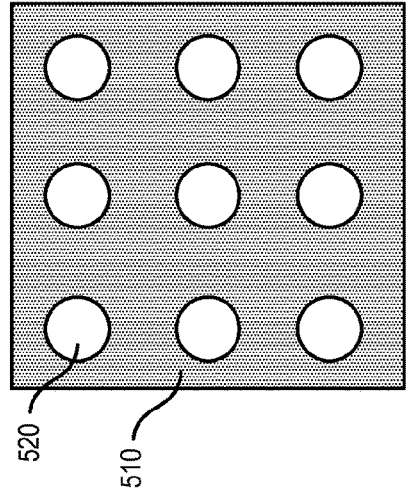
Figure 5D:
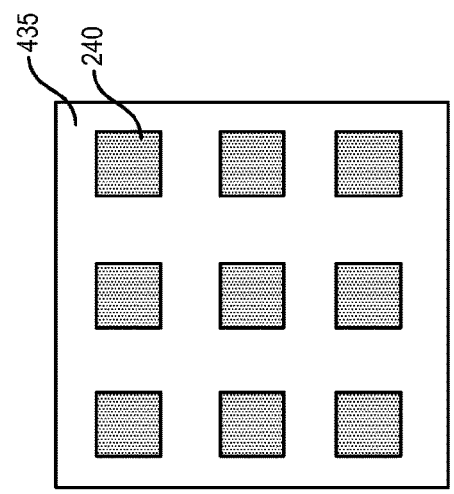

FIGS. 5A and 5B depict different geometrical arrangements of HMM regions 240 in an HMM-LED 200/300. FIG. 5A depicts a top view of an HMM-LED with an arrangement of cylindrical HMM regions arranged with rectangular symmetry, and FIG. 5B depicts an arrangement of cylindrical HMM regions arranged with hexagonal symmetry. Any other geometric arrangement may also be used. FIG. 5C depicts a complementary arrangement where the hole transport layer occupies the cylindrical channels 520 and the HMM regions occupy the volume outside the channels 510. FIG. 5D depicts an example of a arrangement of rectangular prism HMM regions arranged with rectangular symmetry. Any other arrangement or HMM regions is also possible in FIGS. 5A-5D.

The subject matter described herein may be embodied in systems, apparatus, methods, and/or articles depending on the desired configuration. For example, the components of the optical communication systems disclosed herein can be implemented using one or more of the following: a processor executing program code, an application-specific integrated circuit (ASIC), a digital signal processor (DSP), an embedded processor, a field programmable gate array (FPGA), and/or combinations thereof. These various implementations may include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device. These computer programs (also known as programs, software, software applications, applications, components, program code, or code) include machine instructions for a programmable processor, and may be implemented in a high-level procedural and/or object-oriented programming language, and/or in assembly/machine language. As used herein, the term "machine-readable medium" refers to any computer program product, computer-readable medium, computer-readable storage medium, apparatus and/or device (e.g., magnetic discs, optical disks, memory, Programmable Logic Devices (PLDs)) used to provide machine instructions and/or data to a programmable processor, including a machine-readable medium that receives machine instructions. Similarly, systems are also described herein that may include a processor and a memory coupled to the processor. The memory may include one or more programs that cause the processor to perform one or more of the operations described herein.

Although a few variations have been described in detail above, other modifications or additions are possible. In particular, further features and/or variations may be provided in addition to those set forth herein. Moreover, the implementations described above may be directed to various combinations and subcombinations of the disclosed features and/or combinations and subcombinations of several further features disclosed above. In addition, the logic flow depicted in the accompanying figures and/or described herein does not require the particular order shown, or sequential order, to achieve desirable results. Other embodiments may be within the scope of the following claims. Furthermore, the specific values provided in the foregoing are merely examples and may vary in some implementations.

Although various aspects of the invention are set out in the independent claims, other aspects of the invention comprise other combinations of features from the described embodiments and/or the dependent claims with the features of the independent claims, and not solely the combinations explicitly set out in the claims.

It is also noted herein that while the above describes example embodiments of the invention, these descriptions should not be viewed in a limiting sense. Rather, there are several variations and modifications which may be made without departing from the scope of the present invention as defined in the appended claims.

What is claimed is:

1. An apparatus comprising:
   a substrate layer;
   a buffer layer disposed on the substrate layer;
   a charge transport layer disposed on the buffer layer, wherein the charge transport layer comprises a doped semiconductor in electrical contact with at least an electrode;
   a light emission layer disposed on the charge transport layer; and
   another charge transport layer disposed on the light emission layer, wherein the other charge transport layer has a plurality of channels etched into the other charge transport layer, wherein the plurality of channels are spaced periodically and/or aperiodically upon the other charge transport layer, wherein the plurality of channels are etched through the other charge transport layer to leave a residual thickness of the other charge transport layer between a bottom of the etched channel and the light emission layer, and wherein another electrode is in electrical contact with the other charge transport layer; and a metamaterial contained in the plurality of channels, wherein the metamaterial is proximate to the residual thickness of the other charge transport layer, wherein the metamaterial comprises a structure including at least one of a dielectric or a metal.

2. The apparatus of claim 1, wherein the structure comprises a stack of alternating layers of the dielectric and the metal.

3. The apparatus of claim 1, wherein the structure comprises the dielectric with at least one rod of the metal running through the dielectric.

4. The apparatus of claim 1, wherein the structure is only the metal.

5. The apparatus of claim 1, wherein a cross section of the structure has a shape including at least one of a circle, a square, a rectangle, a hexagon, or an octagon.

6. The apparatus of claim 1, further comprising:
an insulating layer surrounding the metamaterial, wherein the channel is etched through the charge transport layer, through the light emission layer, and into the other charge transport layer.

7. The apparatus of claim 1, wherein the charge transport layer is an n-type semiconductor and the other charge transport layer is a p-type semiconductor, or the charge transport layer is the p-type semiconductor and the other charge transport layer is the n-type semiconductor.

8. The apparatus of claim 1, wherein the reduced recombination lifetime in the light emission layer is between 1 picosecond and 1 nanosecond.

9. he apparatus of claim 1, wherein the metamaterial and the structure cause a reduced recombination lifetime in the light emission layer when compared to the apparatus without the metamaterial, wherein the reduced recombination lifetime causes an increased speed of adjusting an output optical intensity of the apparatus.

10. The apparatus of claim 9, wherein the increased speed of adjusting the optical intensity of the apparatus is 1 GHz or higher.

11. The apparatus of claim 1, wherein the apparatus is modulated according to a stream of digital information at a data rate of 1 to 10 gigabits per second or higher.

12. The apparatus of claim 1, wherein the electrode and the other electrode comprise a metal, the hole transport layer is a p-type semiconductor, the electron transport layer is a n-type semiconductor, the buffer layer assists semiconductor growth, the light emission layer has a composition comprising a semiconductor p-n junction or a plurality of quantum wells or a plurality of quantum dots or a plurality of emissive organic materials, and the substrate has a composition comprising a semiconductor or an oxide or a plastic.

13. The apparatus of claim 1, wherein the apparatus is a light emitting diode or an organic light emitting diode.

14. A method of manufacturing a light emitting diode comprising:
providing a substrate layer;
laying a buffer layer disposed on the substrate layer;
laying a charge transport layer disposed on the buffer layer, wherein the charge transport layer comprises a doped semiconductor in electrical contact with at least an electrode;
laying a light emission layer disposed on the charge transport layer; and
laying another charge transport layer disposed on the light emission layer, wherein the other charge transport layer has a plurality of channels etched into the other charge transport layer, wherein the plurality of channels are spaced periodically and/or aperiodically upon the other charge transport layer, wherein the plurality of channels are etched through the other charge transport layer to leave a residual thickness of the other charge transport layer between a bottom of the etched channel and the light emission layer, and wherein another electrode is in electrical contact with the other charge transport layer; and
laying a metamaterial contained in the plurality of channels, wherein the metamaterial is proximate to the residual thickness of the other charge transport layer, wherein the metamaterial comprises a structure including at least one of a dielectric or a metal,
wherein the laying the charge transport layer, the laying the light emission layer, the laying another charge transport layer, and the laying a metamaterial layer are performed in a semiconductor fabrication process.

15. The method of claim 14, wherein the structure comprises a stack of alternating layers of the dielectric and the metal.

16. The method of claim 14, wherein the structure comprises the dielectric with at least one rod of the metal running through the dielectric.

17. The method of claim 14, wherein the structure is only the metal.

18. The method of claim 14, wherein a cross section of the structure has a shape including at least one of a circle, a square, a rectangle, a hexagon, or an octagon.

19. The method of claim 14, further comprising:
an insulating layer surrounding the metamaterial, wherein the channel is etched through the charge transport layer, through the light emission layer, and into the other charge transport layer.

20. The method of claim 14, wherein the charge transport layer is an n-type semiconductor and the other charge transport layer is a p-type semiconductor, or the charge transport layer is the p-type semiconductor and the other charge transport layer is the n-type semiconductor.

* * * * *